United States Patent [19]
Lang et al.

[11] Patent Number: 5,521,482
[45] Date of Patent: May 28, 1996

[54] METHOD AND APPARATUS FOR DETERMINING MECHANICAL PERFORMANCE OF POLYPHASE ELECTRICAL MOTOR SYSTEMS

[75] Inventors: George F. Lang, Lansdale; David O. Heagerty, Glenn Mills, both of Pa.; Glenn R. Kahley, Millville, N.J.

[73] Assignee: Liberty Technologies, Inc., Conshohocken, Pa.

[21] Appl. No.: 293,986

[22] Filed: Aug. 22, 1994

Related U.S. Application Data

[63] Continuation-in-part of Ser. No. 84,691, Jun. 29, 1993.
[51] Int. Cl.⁶ ............................................. H02P 9/00
[52] U.S. Cl. .................................... 318/800; 318/805
[58] Field of Search ................................ 318/606–608, 318/798–812; 340/648

[56] References Cited

U.S. PATENT DOCUMENTS

| | | | |
|---|---|---|---|
| 4,356,443 | 10/1982 | Emery | 324/51 |
| 4,851,766 | 7/1989 | Shiobara et al. | 324/158 MG |
| 4,978,909 | 12/1990 | Hendrix et al. | 324/77 B |
| 5,028,804 | 7/1991 | Lauw | 290/40 C |
| 5,430,362 | 7/1995 | Carr et al. | 318/779 |

FOREIGN PATENT DOCUMENTS

| | | |
|---|---|---|
| 58-139662 | 11/1983 | Japan. |
| 2168497 | 6/1986 | United Kingdom. |
| WO91 07644 | 5/1991 | WIPO. |

*Primary Examiner*—William M. Shoop, Jr.
*Assistant Examiner*—Brian Sircus
*Attorney, Agent, or Firm*—Panitch Schwarze Jacobs & Nadel

[57] ABSTRACT

A method for determining electrical and mechanical performance of a polyphase electric motor system comprises sensing the instantaneous current signal and the instantaneous voltage signal as a function of time for at least one electrical phase of the motor. The sensed current signals and the sensed voltage signals are both processed to provide an instantaneous power factor of at least one electrical phase of the motor as a function of time. The resulting power factor is used to determine the tonal real and the total reactive power of the motor as a function of time. The total real power and the total reactive power signals are bandwidth limited and time-limited. The filtered and time-limited, total real power is then cross-plotted as a function of the filtered and time limited, total reactive power signal, generating a performance diagram. The mechanical performance characteristics of the motor are then extrapolated from the performance diagram.

18 Claims, 9 Drawing Sheets

METHOD AND APPARATUS FOR DETERMINING MECHANICAL PERFORMANCE OF POLYPHASE ELECTRICAL MOTOR SYSTEMS

This application is a continuation-in-part of patent application Ser. No. 08/084,691 entitled "Method and Apparatus for Analysis of Polyphase Electrical Motor Systems" filed Jun. 26, 1993.

FIELD OF THE INVENTION

The present invention pertains to the measurement and analysis of the currents, voltages, power factors, and powers (real, reactive, and apparent) of polyphase motor systems and more particularly to an improved method and apparatus for assessing the mechanical and electrical performance of an induction motor by deducing its various characterizing torques, horsepower and mechanical efficiency from its electrical signature exhibited during start-up.

BACKGROUND OF THE INVENTION

Motors, particularly electrical motors, play a key role in industry. Such motors are used to drive fans, pumps, compressors, valves, and many other machines. It is potentially very costly to allow a significant problem to go on unnoticed in either the motor or the motor driven machine. It is also costly and very time consuming to attempt to repair a nonexistent problem. With present less definitive methods, these costly situations often occur. Thus there is a need for an improved diagnostic method and apparatus as described in the invention for use with motors and motor driven machines.

Present conventional techniques have been developed to monitor motor systems. One commonly used conventional technique involves analyzing the signature developed from a single motor current probe in order to ascertain motor fault conditions. However, there are shortcomings associated with this and other standard motor monitoring techniques which prevent optimal motor analysis.

A first problem with conventional current probe technology for motor system analysis is that current and voltage envelopes are generally estimated using inexact demodulation techniques such as RMS to D.C. conversion or rectification, followed by low-pass filtering. These signal processing methods exhibit a slow response to rapidly changing current or voltage signals since they rely heavily on low-pass filtering. This reliance results in an inaccurate response to highly dynamic current features such as inrush current.

A second problem with such conventional technology for motor analysis is non-linearity in the current probes, especially at the lower part of their detection range. This problem is often dealt with by specifying a lesser accuracy at low currents changing the specification from percent reading to percent full scale, or simply not specifying the accuracy over a portion of the detection range.

A third problem with such conventional technology is the distorting influence of filters, non-simultaneous analog-to-digital converter sampling, and other hardware-induced signal processing errors in which the true phase relation between measurement channels is impaired.

A fourth shortcoming of some conventional methods is the need to take the motor off-line in order to ascertain resistive and inductive imbalance. This is a great inconvenience when dealing with continuous-duty motors. In addition, the off-line measurements may not be truly representative of the on-line resistive or inductive balance, since operational stresses may significantly change the state of balance.

A fifth shortcoming with present conventional technology is the exclusive reliance on electrical measurements alone to monitor and diagnose all problems in such motor systems. A motor is not just electrical; it is an electromechanical device, encompassing as well the mechanical aspects of the driven machine, and analyzing either the electrical or the mechanical aspects in isolation ignores important monitoring and diagnostic information.

The mechanical performance of an electrical motor is traditionally evaluated using a dynamometer coupled to the output shaft of the motor to determine the torque and horsepower at various steady state operating conditions. Normally, electrical voltage and current input and shaft speed are measured at a series of torque loadings specified by the dynamometer.

A Heyland diagram is often constructed to estimate a motor's performance capabilities when full dynamometer testing is not possible. The Heyland diagram provides an approximation of the mechanical performance which may be expected from the motor. The Heyland diagram is constructed by conducting two steady-state tests on the motor, one with the shaft uncoupled from any load (no-load) and the other with the shaft locked to prevent rotation (locked rotor). Electrical measurement of the voltages applied to the motor and the currents entering the motor are made during the no-load and locked rotor tests. The voltages and currents are analyzed to determine the real power dissipated by the motor and the reactive power that oscillates through the motor without dissipation. A no-load test is performed by operating the motor with the motor shaft uncoupled from any external load. In a locked rotor test, the motor shaft is mechanically restrained so that it cannot rotate. Voltage and current measurements are made during a brief application of power to the motor. It is normally necessary to conduct locked rotor tests using deliberately reduced line voltages, since currents five to eight times the rated value would otherwise be incurred. Measured currents are then scaled by the ratio of normal to reduced main voltages prior to plotting the points on a diagram. The two tests are used to plot two points on a plot of real power against reactive power. A circular arc is curve fitted to these two data points. Then, from this arc (the Heyland diagram), the behavior of the motor between these extremes can be predicted, providing reasonable estimates of the maximum horsepower, horsepower at most efficient operation, maximum torque, starting torque and efficiency.

The present invention overcomes many of the problems of present conventional monitoring techniques by providing a method and apparatus which improves the quality of voltage/current envelope estimation by utilizing an analytic signal approach in which the signal is uniquely defined in terms of quadrature components, and to do so for polyphase motors so that the estimation of polyphase variables such as motor power is improved as well as that of parameters primarily associated with individual phases, such as voltage and current. The present method and apparatus overcomes the non-linear effects of a current probe by modeling the true probe response in software, estimating the model parameters using actual calibration data, and subsequently correcting all measured current values utilizing the model. The present method and apparatus also overcomes the effect of sampling skew and other measurement channel time delay effects by accurately estimating channel-to-channel phase delays using an analytic signal approach in which quadrature components are used to calculate the instantaneous phases of the multi-channel signals, and the instantaneous values are statistically combined to yield accurate cross-channel phase corrections. In addition, the present method and apparatus provides a measure of inphase and reactive imbalance during operation by comparing the voltage and current phasers. Finally, the present method and apparatus enhances the monitoring and diagnostic capability of motor monitoring techniques by simultaneously measuring electrical and mechanical variables, using both types of variables together to more definitively diagnose the existence of certain faults, some of which both types of measurements are sensitive to, and some of which only electrical or only mechanical measurements are sensitive to.

In a further embodiment, the present invention provides a method and apparatus for evaluating the output torque and shaft horsepower without employing a dynamometer or other torque measuring equipment. The present invention eliminates the need for locked rotor testing and measures the entire Heyland locus from a no-load to locked rotor condition whenever the motor is turned on.

SUMMARY OF THE INVENTION

Briefly stated, the present invention comprises a method and apparatus for determining at least one operating parameter to determine the operating condition of a polyphase electric motor system. The method comprises the steps of sensing the instantaneous current signal as a function of time for more than one electrical phase of the motor. The instantaneous voltage signal is also sensed as a function of time for more than one electrical phase of the motor. The sensed current signals and the sensed voltage signals are amplitude demodulated to provide an amplitude demodulated current signal as a function of time and an amplitude demodulated voltage signal as a function of time for more than one electrical phase. The sensed current and sensed voltage signals are also phase demodulated to provide a phase demodulated current signal as a function of time and a phase demodulated voltage signal as a function of time for more than one electrical phase. The amplitude demodulated current and voltage signals and the phase demodulated current and voltage signals are used to determine at least one electrical motor operating parameter as a function of time from the group consisting of total real power, real power per phase, total reactive power, reactive power per phase, total apparent power, apparent power per phase, overall power factor, power factor per phase, electrical impedance per phase, and electrical balance.

The present invention further provides a method and apparatus for determining electrical and mechanical performance of a polyphase electrical motor system using an electrical signature of the motor during start-up. The method comprises the steps of sensing the instantaneous current signal as a function of time for at least one electrical phase of the motor. The instantaneous voltage signal is also sensed as a function of time for at least one electrical phase of the motor. The sensed current signals and the sensed voltage signals are amplitude demodulated to provide an amplitude demodulated current signal as a function of time and an amplitude demodulated voltage signal as a function of time for the at least one electrical phase of the motor. The sensed current signals and the sensed voltage signals are used to determine an instantaneous power factor as a function of time for the at least one electrical phase of the motor. The amplitude demodulated current and voltage signals and the instantaneous power factor are used to determine a total real power signal as a function of time and a total reactive power signal as a function of time. The total real power and total reactive power signals are then low-pass filtered, time-limited, and then cross-plotted.

The present invention further provides an apparatus for determining electrical and mechanical performance of a polyphase motor system using an electrical signature of the motor during start-up. The apparatus comprises a current sensor for transducing currents applied to the motor and generating an analog current signal for at least one electrical phase of the motor, a voltage sensor for sensing a line voltage applied to the motor and generating an analog voltage signal for at least one electrical phase of the motor. An analog-to-digital converter is provided for converting the analog current and voltage signals to digital current and voltage signals. A storage device stores a time history of the digital current and voltage signals. A demodulator is provided for generating amplitude demodulated current and voltage signals and phase demodulated power factor signals from the digital current and voltage signals. An arithmetic unit is provided for determining instantaneous total reactive power and instantaneous total real power signals using the demodulated current and voltage signals and power factor signals. An arithmetic low-pass filter is provided for bandwidth limiting the total real power signal and the total reactive power signal. An arithmetic time-limiter is provided for time-limiting the filtered, total real power signal and the filtered, total reactive power signal. A plotting device is provided for cross-plotting the time-limited, filtered, total real power as a function of the time-limited, filtered, total reactive power. The mechanical performance characteristics of the motor, such as output torque and shaft horse power may then be extracted from the cross-plot.

BRIEF DESCRIPTION OF THE DRAWINGS

The foregoing summary, as well as the following detailed description of a preferred embodiment of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings.

DETAILED DESCRIPTION OF PREFERRED EMBODIMENT

Figure 1:
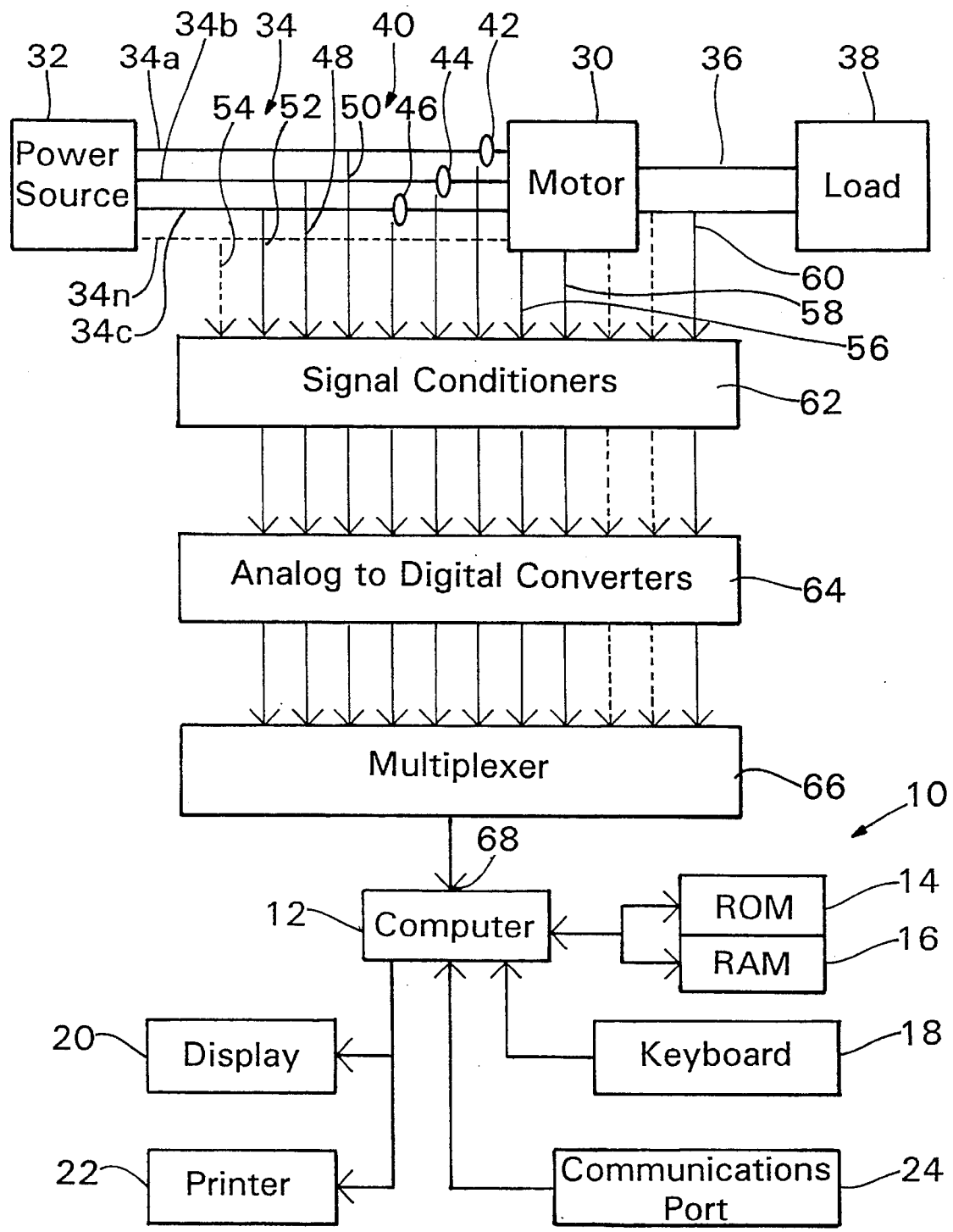
FIG. 1 is a functional schematic block diagram of a preferred embodiment of a system for analysis of a three phase motor in accordance with the present invention.

Referring to the drawings, wherein the same reference numerals indicate like elements throughout the several figures, there is shown in FIG. 1 a functional schematic block diagram of a preferred embodiment of a computer-based system 10 in accordance with the present invention. In the presently preferred embodiment, the system 10 includes a computer 12 which preferably is a personal computer or equivalent. The computer 12 includes a read only memory (ROM) 14 employed for storing fixed information including a computer program and random access memory (RAM) 16 of a predetermined size which is adapted for temporary storage of portions of a computer program as well as data for analysis. The computer 12 further includes a central processing unit or processor (not shown) and, in the present embodiment, a hard disk (not shown) of a type typically employed in such personal computers. While it is presently preferred that the computer 12 comprise a personal computer, it should be appreciated that any other suitable type of computer, such as a lap-top computer, mini computer, microprocessor, digital signal processor, or the like, may alternatively be employed.

A keyboard 18 is employed as the primary input device to permit a user to communicate with the computer 12. A display, in the present embodiment a CRT display 20, and a suitable printer 22 are connected to the computer 12 for the display and recording of output from the computer 12. It will be appreciated by those skilled in the art that any other type of input device may be employed instead of or in addition to the keyboard 18. Likewise, any other type of suitable output device may be employed in addition to or instead of the display 20 and/or printer 22.

The computer 12 further includes an least one communication port 24 which may be either a parallel ports a serial port, or both. The communication port 24 is employed for receiving data from another location or sending data to another location utilizing a modem or other such transmission device (not shown) in a manner well known in the computer art.

The system 10 as thus far described is typical of a personal computer system well known to those skilled in the art. Variations in the input/output components of the system 10 may be made depending upon particular applications. For example, in some applications, it will not be necessary for both a printer 22 and a display 20. In other applications, a keyboard 18 may not be necessary. It should, therefore, be clearly understood by those skilled in the art that the present invention is not limited to the .particular hardware configuration shown in FIG. 1 but may be implemented using any type of suitable hardware configuration.

The above-described system 10 is employed for on-line analysis of the operation of a polyphase motor driving a load, the polyphase motor being illustrated here schematically as a three-phase motor 30. The motor 30 is connected to a suitable power source 32 utilizing a suitable three-phase cable 34 having individual conductors including an a-phase conductor 34a, a b-phase conductor 34b, a c-phase conductor 34c, and if appropriate, a neutral conductor 34n.

The output of the motor 30 is connected through a suitable output shaft or other type of mechanical transmission means 36 to a load 38 which may be a fan, pump, compressor, valve or virtually any other type of machinery or equipment. Depending upon the application, the transmission means or transmission 36 may include suitable clutches, gearing, belts or other mechanical interconnecting devices (not shown) of a type well known in the art. For the sake of brevity, the combination of the motor 30, transmission 36, and the load 38 will herein sometimes be collectively referred to as the motor system. It should be appreciated by those skilled in the art that the present system 10 may be employed for analysis of any type of polyphase motor 30 which may be connected to any suitable type of power source 32 for driving any type of load 38 (even no-load) utilizing any type of transmission means 36, and that the embodiment shown in FIG. 1 is only for the purpose of illustrating a preferred embodiment of the structure and operation of the present invention.

The system 10 further includes a plurality of individual sensors shown collectively as 40, for monitoring predetermined electrical and mechanical variables of the motor 30 and transmission means 36, and for converting the monitored characteristics into electrical signals for processing by the computer 12. In the present embodiment, the sensors 40 include three clamp-on current probes 42, 44, 46, one of the current probes being clamped to each of the conductors 34a, 34b, 34c, of the three phase cable 34 interconnecting the motor 30 with the power source 32. The clamp-on current probes 42, 44, 46 are generally of a type well known in the electrical measurement art and are commercially available from a variety of well known sources. The currents may also be transduced by current shunts or by current transformers instead of the clamp-on type of sensors. The sensors may be applied to the motor circuit directly or to any control circuit which follows the phase currents proportionally. Complete details of the structure and operation of the current probes is not necessary for a complete understanding of the present invention.

Figure 2:
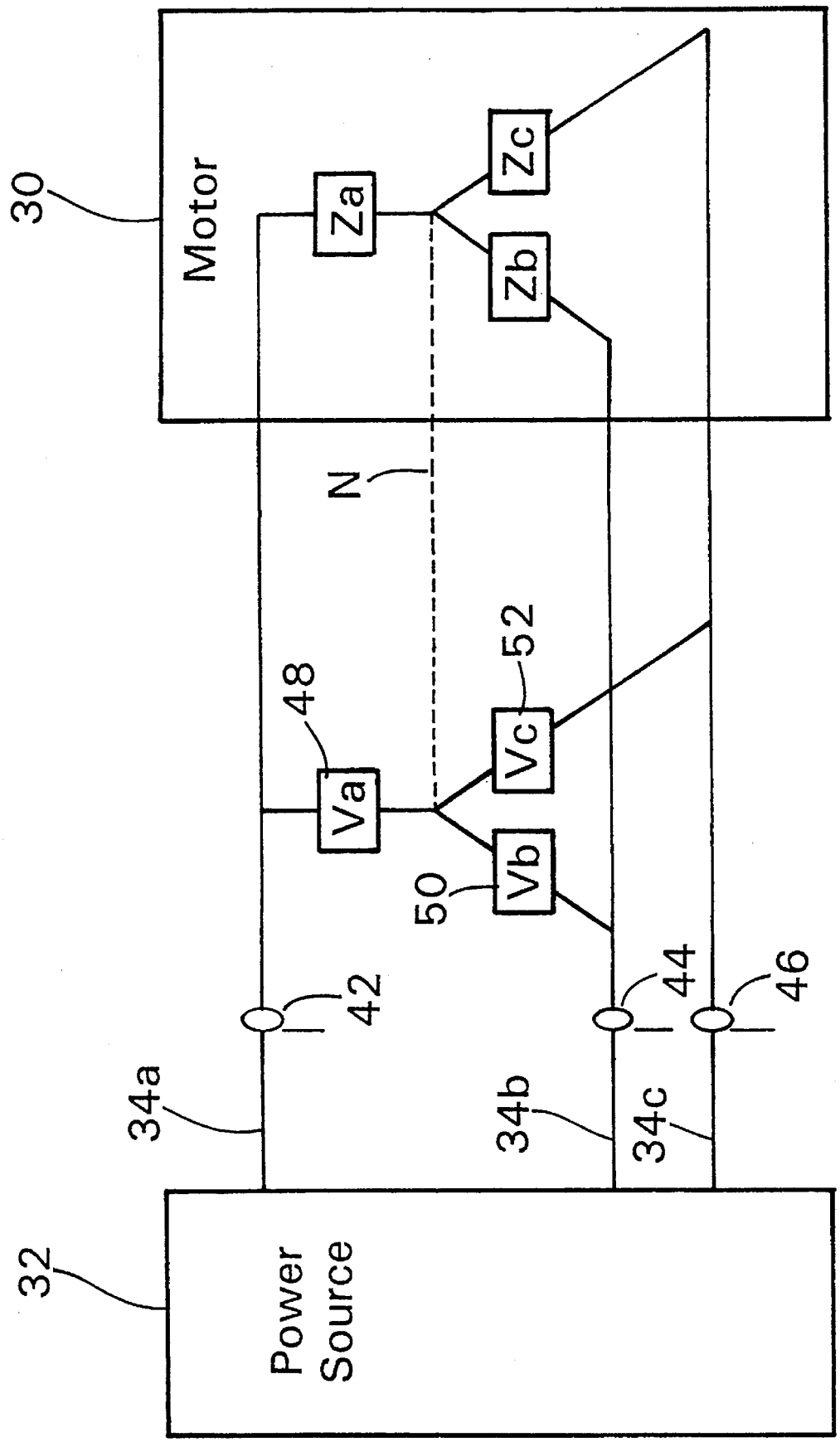
FIG. 2 is a more detailed functional schematic diagram of a portion of the system shown in FIG. 1.

The sensors 40 further include voltage probes 48, 50, 52, each of which is connected to one of the conductors 34a, 34b, 34c of the three phase cable 34 and, if a neutral conductor 34n is present, a fourth voltage probe 54 is connected to the neutral conductor 34n of the cable 34. FIG. 2 shows in greater detail the manner in which the electrical measurements are taken. In the illustrated embodiment, the motor 30 is connected in a wye configuration with an artificial neutral phase. One terminal of each of the voltage probes 48, 50, 52 is physically connected to each of the individual phase conductors 34a, 34b, 34c, respectively, with the other terminals of the voltage probes 48, 50, 52 being connected together to form an artificial neutral. An optional neutral connection line shown in phantom may be connected to the neutral of the motor circuit when the motor circuit is accessible. It should be understood that while the motor 30 illustrated in the present embodiment is connected in a wye configuration, it could be connected in a delta configuration and the voltage probes 48, 50, 52 could be accordingly connected in a delta configuration in a manner which is well known in the art. The voltage probes 48, 50, 52 are generally of a type well known in the art and are commercially available from a variety of sources. The voltage probes may also be of the potential transformer type commonly used at higher voltages or the voltage probes may be some other type not described herein. Complete details of the structure and operation of the voltage probes 48, 50, 52 is not necessary for a complete understanding of the present invention.

In addition to the above-discussed electrical sensors, the present system 12 may include one or more mechanical sensors. The mechanical sensors may include a vibration sensor 56 which may be an accelerometer, an acoustic sensor 58, and a tachometer 60 providing a once per revolution phase reference for sensing the rotating speed of the output shaft of the motor 30 and of the shaft of the load 38 if different due to an intervening gear box or belt within the transmission 36. One or more additional mechanical probes may also be provided. Such additional mechanical probes may include pressure transducers and vibration sensors, proximity probes, force sensors, torque sensors and accelerometers having different locations or orientations from that of sensor 56, etc. Each of the mechanical sensors are adapted to receive and convert sensed mechanical parameters related to the operation of the motor system into analogous standard electrical signals. Details of the structure and operation of the various mechanical sensors are not necessary for a complete understanding of the present invention. It should be understood by those skilled in the art that while certain mechanical sensors are specifically discussed and illustrated, other mechanical sensors may be employed either in addition to the discussed sensors or as an alternative to the discussed sensors. Thus, the particular type of mechanical sensors employed in the presently preferred embodiment should not be viewed as a limitation upon the invention.

The system 10 further includes a plurality of signal conditioners 62 which are illustrated collectively in FIG. 1. Preferably, a separate signal conditioner is provided for each of the sensors 40, with the respective output of the sensor 40 being connected directly to the input to the respective signal conditioner 62. Each of the signal conditioners 62 functions in a manner well known in the art to amplify, impedance match, filter and otherwise standardize and improve the electrical output signal received from the corresponding sensor 40. Standardization of signals includes conversion of currents to a proportional voltage, amplitude scaling and appropriate filtering to limit bandwidth. The precise structure and operation of each signal conditioner depends upon the particular type of sensor 40 with which the signal conditioner 62 is employed. Preferably, each of the signal conditioners 62 further includes an anti-alias low pass filter which functions to improve the integrity of the acquired sensor data by filtering out, prior to digitizing, sensor signal frequencies greater than approximately half of the sampling rate of the digitizer.

The system 10 further includes a plurality of individual analog-to-digital converters 64 shown collectively FIG. 1. The analog-to-digital converters 64 function in a manner well known in the art to receive the conditioned and filtered analog output signals from the corresponding signal conditioner 62 and convert the received analog signals at a predetermined sampling rate into digital signals for data manipulation and analysis by the computer 12. A typical sampling rate could be 1,000 samples per second for each signal. Thus, each of the analog-to-digital converters 64 produces an output data array or bit stream corresponding to the particular sensor 40 with which the analog-to-digital converter is associated.

The outputs of each of the analog-to-digital converters 64 are provided to the input of a multiplexer 66. The multiplexer 66 which, in the present embodiment is preferably a time division multiplexer, receives the data array signals from each of the analog-to-digital converters 64 and in a manner well known in the art transmits the received data array signals to an appropriate serial input port 68 of the computer 12 in a predetermined time spaced order.

It will be appreciated by those skilled in the art that the signal conditioners 62, analog-to-digital converters 64, and multiplexer 66 which are employed in connection with the presently preferred embodiment, are each of a type well known in the art and available from a variety of manufacturers. Complete details of the structure and operation of the signal conditioners 62, analog-to-digital converters 64, and multiplexer 66 are generally well known to those skilled in the art and need not be described in greater detail herein. Suffice it to say that the signal conditioners 62, analog-to-digital converters 64, and multiplexer 66 cooperate to take the raw analog output electrical signals from the electrical and mechanical sensors 44 and convert the raw signals into a digital form suitable for processing by the computer 12. It will be appreciated by those skilled in the art that the functions of the signal conditioners 62, analog-to-digital converters 64, and multiplexer 66 may be combined into a single sub-assembly or may be performed in any of several different manners. Thus, while the preferred embodiment employs such components, such components are not intended to be a limitation on the present invention.

Figure 3:
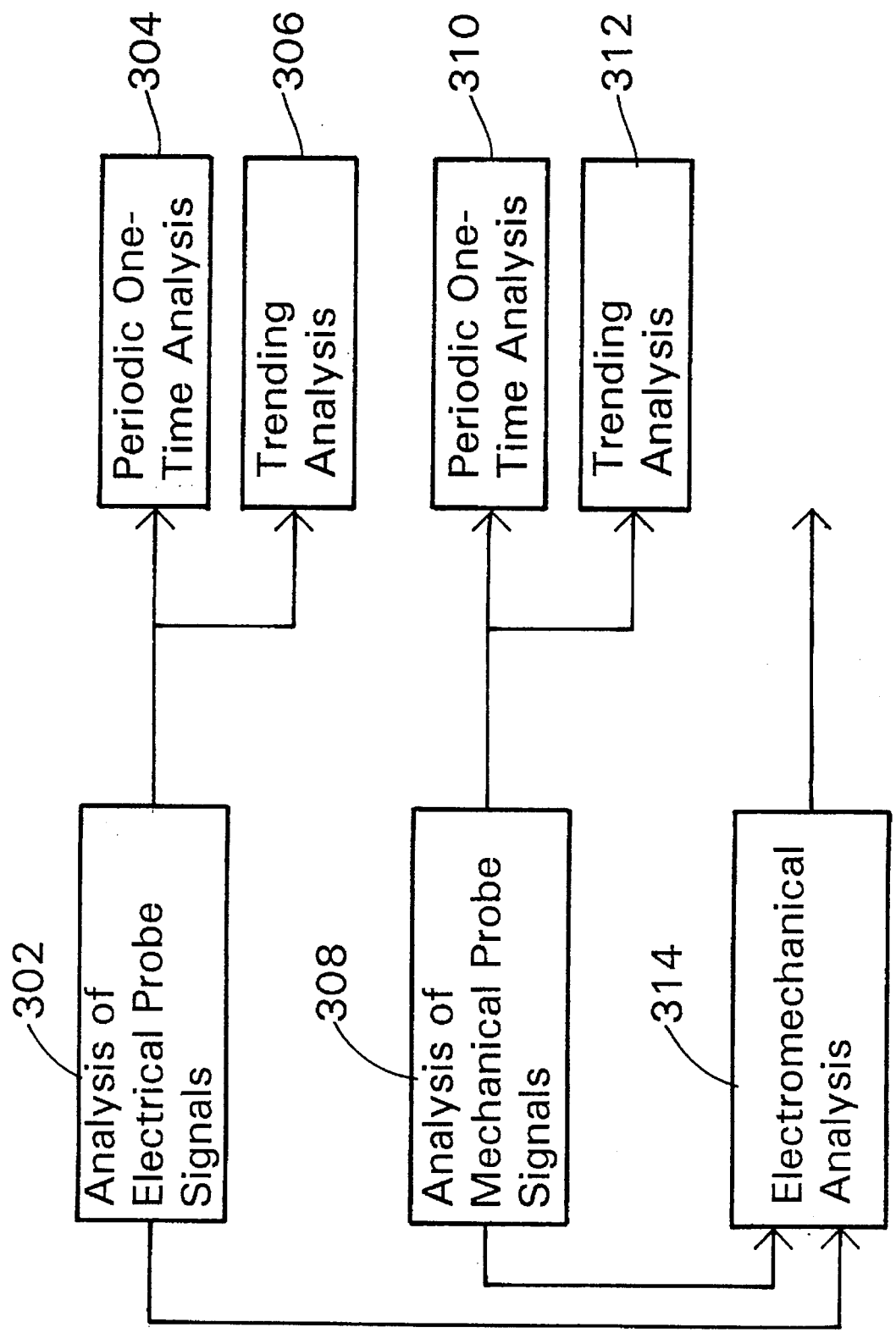
FIG. 3 is a high level functional block diagram of the software operation of the system of FIG. 1.

FIG. 3 is a general functional block diagram of the operation of the computer 12 in providing analysis of the operation of the polyphase motor 30, its transmission 36, and its load 38 (i.e., the motor system). The computer 12 manipulates the sampled digital data received from the electrical and mechanical sensors 40 in a manner hereinafter described and generates highly accurate outputs in the form of discrete data or plots of data versus time (traces) corresponding to particular electrical and mechanical parameters from which specific problems and faults can be identified. Only the particular identified problem(s) need then be repaired, be it on the motor 30, transmission 36, or load 38, thereby saving the cost of a complete motor system overhaul. As illustrated in FIG. 3, the computer 12 essentially simultaneously performs three different but interrelated analyses. The sampled output signals from the electrical probes, representing voltage and current values as a function of time, are analyzed at block 302 to accurately determine a first group of generally electrical motor parameters which include power factor, motor power and the electrical balance of the motor 30 initially indicated in the form of discrete values as a function of time at the same sample rate as the data. From the determined parameters, the computer 12 conducts periodic one-time operational analyses 304 which do not use or depend upon historic data, as well as a generally continuous trending analysis 306 in which historic trending of the first group of motor parameters are taken into consideration to identify trends occurring within the motor 30. The computer 12 simultaneously conducts an analysis of the output signals from the mechanical probes at block 308 to determine a second group of generally mechanical motor system parameters containing information about mechanical balance, misalignment, faulty bearings and gears, and other such mechanical faults. As with the electrical motor parameter analysis, the mechanical parameter analysis includes periodic one-time analyses 310 of each of the mechanical motor parameters, as well as longer term trending analysis 312 which takes into consideration prior calculations of the mechanical parameters in order to identify trends in the operation of the motor 30, transmission 36, and load 38 and to perhaps indicate impending mechanical faults. Finally, the electrical analysis 302 and mechanical analysis 308 are combined to provide a more comprehensive electromechanical analysis 314. In one form of the electromechanical analysis 314, the electrical analysis 302 is viewed as data representing the input to the motor 30, and the mechanical analysis 308 is viewed as the motor output. By comparing the input and output of the motor 30, the efficiency of the motor 30 can be estimated and developing inefficiencies, such as lubrication degradation, can be identified. This type of input-output view also helps to isolate problems as occurring either to the electrical front end or the mechanical back end, and can be used to guide and confirm changes to improve motor system efficiency. The electromechanical analysis 314 can also be used to confirm suspected conditions which appear in both the electrical and mechanical analysis. In addition, transfer functions (frequency response functions) between the electrical and mechanical measurements, can be used to indicate the transmission of fault signals between components and the coherence function of such signals can be used to indicate the degree of common cause of fault.

Figure 4:
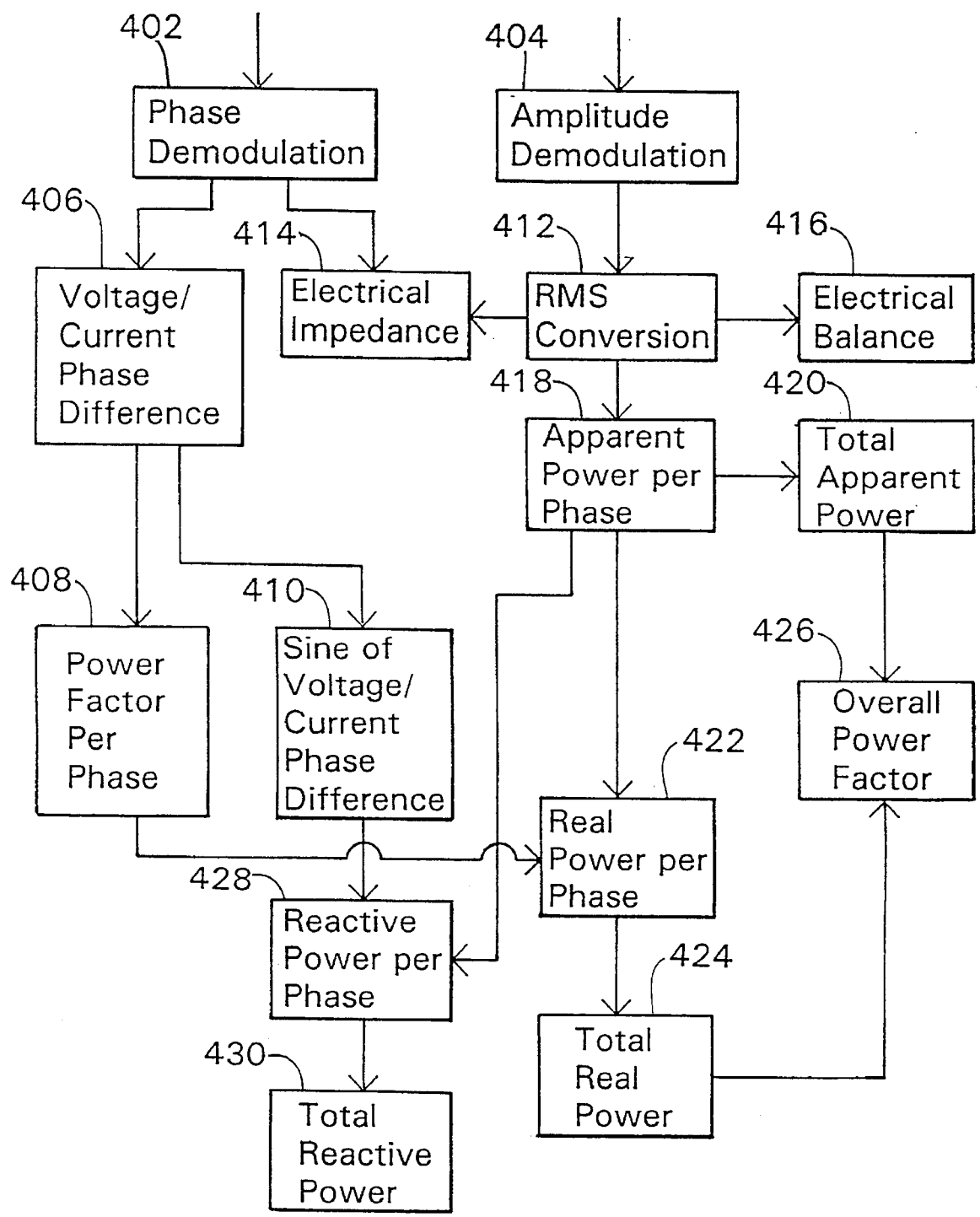
FIG. 4 is a more detailed functional block diagram of the electrical signal analysis portion of the software operation of the system of FIG. 1.

FIG. 4 is a more detailed functional block diagram representation of the steps followed by the computer 12 in analyzing the electrical probe signals. In the presently preferred embodiment, each of the conditioned and digitized signals from each of the three current probes 42, 44, 46, and from the three voltage probes 48, 50, 52 are individually analyzed and processed by the computer 12.

It is generally known that the signals developed by the electrical probes 42, 44, 46, 48, 50, 52 are modulated. For example, in-rush current during start-up of an induction motor is associated with highly dynamic amplitude modulation at the fundamental motor drive frequency (60 Hz or 50 Hz).

In order to improve the accuracy of the estimated voltage and current envelopes, the present invention uses one of several possible analytic signal approaches to more accurately demodulate each of the signals received from the current and voltage probes. The signals from the current and voltage probes are each phase demodulated at block 402 and amplitude demodulated at block 404 with the demodulated results being employed to determine the various electrical motor parameters. In the preferred embodiment, the phase demodulation 402 and amplitude demodulation 404 is accomplished by generating an equivalent analytic signal for each electrical probe.

The analytic signal may be generated for each electrical probe in several different ways. Preferably, the analytic signal is generated by treating the original real signal from each probe as the real part of the analytic signal and then creating an imaginary part of the analytic signal by phase shifting the original real signal by ninety degrees at every frequency it contains. Preferably, the calculation of the imaginary part is accomplished in the time domain using a Hilbert transform or some other such ninety degree phase shifter. The analytic signal is the vector sum of the real and imaginary parts.

The analytic signal can alternatively be obtained by calculating the two-sided spectrum of the measured signal, deleting the negative frequency part of the spectrum and then performing an inverse Fourier transform on two times the positive frequency part to obtain the resulting complex signal. The imaginary part of the complex or analytic signal is 90 degrees out of phase with the real part. Another technique for generating the analytic signal is to heterodyne (multiply) the real signal by a cosine wave to create an inphase (real) part and by a negative sine wave to create a 90 degrees out-of-phase quadrature (imaginary) part, low-pass filtering each part, and then calculating the instantaneous amplitude as the square root of the sum of squares of the in-phase and quadrature parts. Other quadrature-based methods for calculating the analytic signal may be used in the alternative. It should be understood that the specific method employed for determining the analytic signal should not be viewed as a limitation on the present invention.

After phase demodulation 402, which provides angular phase as a function of time of the individual sampled signals including all the voltages and currents, the phase difference between the voltage and current in each electrical phase as a function of time is determined at block 406. The voltage/current phase difference is determined by simply subtracting the angular current phase from the angular voltage phase for each electrical phase (a, b or c).

The power factor for each electrical phase is then determined in block 408 by determining the cosine of the voltage/current phase difference determined in block 406. The sine of the voltage/current phase difference determined in block 406 is also calculated in block 410 for purposes which will hereinafter become apparent. Alternatively, the latter value may be evaluated as the square root of the sum of squares of unity less the square of the power factor for each phase from block 408.

The amplitude demodulation accomplished in block 404 yields very accurate voltage and current envelopes for each of the phases. Since most power parameters are expressed in terms of rms, the envelopes, which yield peak values, are multiplied by the square root of 0.5 to effectively convert the amplitude demodulated outputs from block 404 for each phase into corresponding rms values at block 412. Several useful parameters are thereafter developed from the converted rms values output from block 412.

The instantaneous equivalent electrical impedance of the motor 30 is determined in block 414. The determination of electrical impedance is accomplished by dividing the complex voltage for each phase by the complex current for each phase. In the present embodiment, in polar form, the electrical impedance can be evaluated as the ratio of the instantaneous amplitudes and the subtraction of the instantaneous phases which are then converted to a complex form.

Electrical balance or imbalance is determined at block 416 utilizing all three phases. It is well known that it is stressful for a motor to operate continuously in a state of electrical imbalance. Current imbalance, voltage imbalance and resistive and inductive imbalances are all important indicators of general motor electrical health. The electrical imbalances, voltage, current, resistance, reactance, etc., are typically quantified by the formula:

$$\frac{\text{High Value} - \text{Low Value}}{\text{Average Value}} \times 100\%$$

The present invention permits on-line determination of electrical impedance at block 414 as well as electrical balance at block 416 while the motor 30 is in actual operation. Conventional methods involve taking the motor 30 off line to make the necessary static and unloaded measurements in order to permit calculation of electrical impedance and/or electrical balance. For example, conventional methods must measure static imbalances off-line and then use the measurements to estimate the imbalances during operation. The ability of the present invention to accurately determine electrical impedance and electrical balance during actual motor operation facilitates trending analysis which provides the ability to obtain advance warning of developing problems in the motor. The electrical impedance per phase from block 414 and the electrical balance from block 416 are displayed on the display 20 and, if desired, a hard copy may be printed by the printer 22.

These parameters may be used to detect shorted windings, high contact resistance, and other degradations that typically do not occur equally in each phase.

The instantaneous current and voltage rms values for each phase are multiplied together at block 418 to obtain an indication of apparent power per phase referred to as instantaneous power per phase. Total apparent power or instantaneous power is the sum of the apparent power per phase for all three phases and is determined at block 420. The real power per phase is determined at block 422 as the product of the apparent power per phase from block 418 and the power factor per phase from block 408. The total real power is then obtained at block 424 by adding together the real power per phase for each of the phases from block 422. The real power per phase from block 422 and the total real power from block 424 are displayed on the display 20 and, if desired, a hard copy may be printed by the printer 22.

Figure 5:
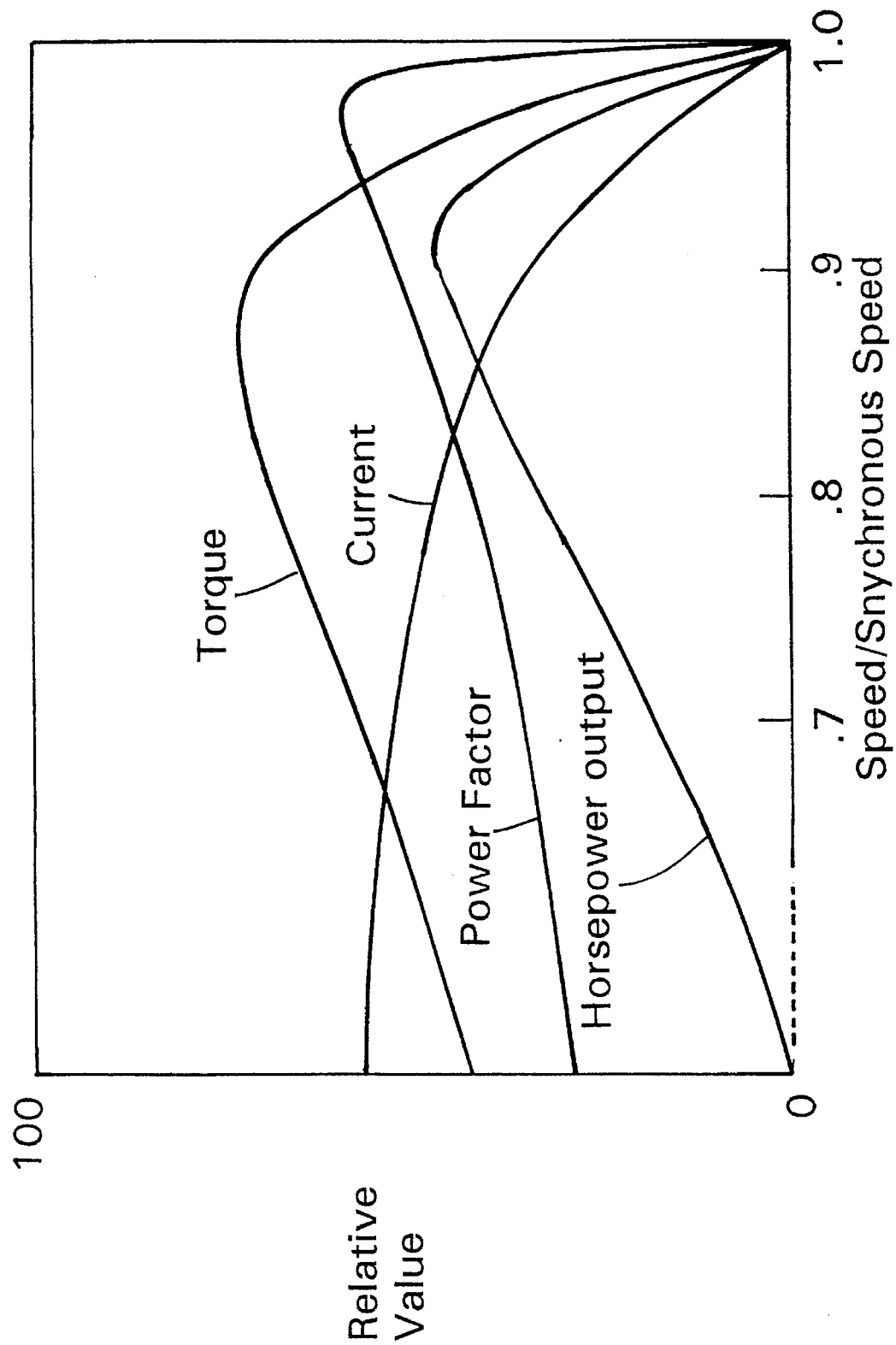
FIG. 5 is a graphic illustration of the relationship between certain operating parameters of an induction motor.

The overall power factor for the motor 30 is calculated at block 426 by dividing the total real power from block 424 by the total apparent power from block 420. The overall power factor is a more sensitive indicator of load changes than is the instantaneous current when the motor is lightly loaded. FIG. 5 illustrates the relatively steeper slope (high sensitivity) of the overall power factor as compared to the current where the speed approaches synchronous speed typical of light loading. Also shown in FIG. 5 are the curves of torque and horsepower output. The overall power factor from block 426 is displayed on the display 20 and, if desired, a hard copy is provided by the printer 22. The overall power factor trace, as a function of timed is the optimum electrical diagnostic trace under light loading conditions for the reasons cited above.

Referring again to FIG. 4, the reactive power per phase is determined at block 428 as the product of the apparent power per phase and the sine of the voltage/current phase difference. Adding together the determined reactive power per phase for each phase results in the total reactive power at block 430. The reactive power per phase from block 428 and the total reactive power from block 430 are both displayed on display 20 and may be printed out on the printer 22 is desired. Reactive power is wasteful because it requires current, but does not deliver real power to the load.

The analytic signal approach for the demodulation of the outputs of the voltage and current sensors provides improved accuracy of estimation of the instantaneous amplitude and phase for each probe signal individually as well as improved accuracy of the important composite measures of power, power factor, and electrical balance. Accurate demodulation is very important for such polyphase measurements since it permits the calculation of total power, overall power factor, and motor balance in a highly accurate manner.

Figure 6:
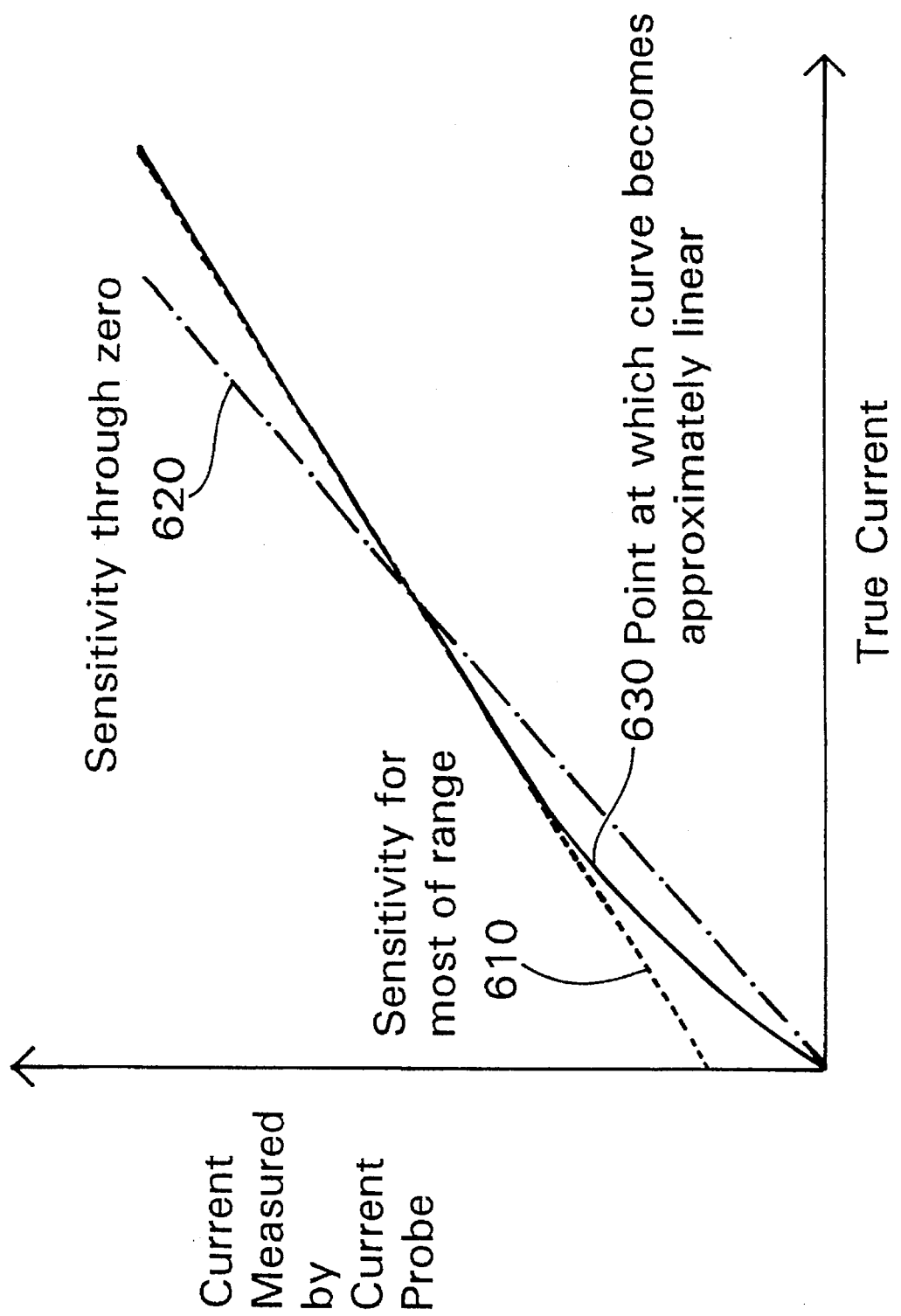
FIG. 6 is a graphic illustration of the linearity aspects of typical current probes.

It is known in the art that current probes of the type typically used in measuring motor current can have a degree of non-linearity associated with them. The nonlinearity of such current probes is illustrated by the solid line in FIG. 6, which shows the measured current indicated by a typical commercially available current probe along the Y axis as a function of the true current along the X axis. As shown by the dashed line 610 on FIG. 6, such current probes are reasonably linear over a large percentage of the range. The overall sensitivity is shown by dotted line 620. The point at which the probe becomes non-linear on the low end is identified as point 630. There is often a similar point where the probe becomes non-linear on the high end of the curve which is not illustrated in FIG. 6.

The non-linearities of such existing current probes have several adverse effects when employed for motor analysis. First, such non-linearity reduces the overall accuracy of the sensed current data from the motor, particularly at the low current end. Second, such non-linearities often force the avoidance of using either the high end or low end of the curve in order to assure accurate data. It is difficult and costly to obtain probes with high accuracy across the entire range with a specific required linearity.

The present invention overcomes the non-linear effects of the existing current probes by utilizing the computer 12 to correct the probe characteristics via software, based upon actual calibration data. The computer 12 records indicated probe outputs against actual current levels over the full range of expected current levels. The computer 12 then applies appropriate corrections to subsequently correct all current values indicated by that current probe. The computer correction is based upon a mathematical function that approximates the probe input-output curve at all points. In the preferred embodiment, the curve is sectorized, applying different mathematical functions to different ranges of the curve. Preferably, the curve is divided into three sectors, with each sector being approximated by a cubic polynomial whose coefficients are derived by the well known least squares approximation technique. Zero is a common reference point since the current probe channel output can always be adjusted to zero in the absence of any current. Thus, the sector closest to zero is forced through zero and the other sectors have an added offset. To smooth the transitions between sectors, neighboring points from adjoining sectors are included when calculating the cubic coefficients.

As a first alternative, a larger number of lower order sectors, such as eight linear sectors, may be employed to provide the mathematical model of the input-output curve. A further alternative is to approximate the curve based upon Fourier coefficients. Since the non-linearity of the curve repeats every cycle of the current (i.e., sixty times per second for a 60 Hz electrical signal), the distortion of the output signal can be described in terms of a Fourier series and may be approximated by a truncated Fourier series. When viewed in this manner, the non-linearity in the input-output relation of the probe is essentially equivalent to harmonic distortion in the output wave form. Evidence suggests that non-linearity is a fixed function of the probe. That is, the peak of a five amp signal, for example, produces the same output as the halfway to peak value of a ten amp signal. In terms of harmonic distortion, the fixed function translates into the condition that the phase relation between the fundamental electrical frequency and its harmonics must be either zero or 180 degrees, thereby simplifying the Fourier solution to the problem. The Fourier series coefficients (amplitude, magnitude and phase) are best determined utilizing the analytic signal approach described above. For zero to 180 degrees, the error in amplitude in terms of the Fourier coefficients is:

$$\text{error} = \sum_{k=2}^{K} A_k \cos \left\{ K \cos^{-1}\left(\frac{x_1}{A_1}\right) + \theta_k - k\theta_1 \right\}$$

where k=harmonic number (1=fundamental)

K=maximum harmonic considered

A=amplitude x=instantaneous current value

θ=phase

Knowing the error due to the presence of harmonics enables correction by cancelling the error. In this manner, knowing that the error is due to the presence of the harmonic, enables correction by cancelling the error.

The present invention also overcomes system effects which distort angular phase relationships such as channel skew from non-simultaneous sampling and non-linear phase response of system filters. In the preferred embodiment, the phase of a single known source is measured using multiple probes on multiple channels. If the source is maintained at a known power factor, then any difference between current and voltage phase measurements can be attributed to system errors, i.e., the combination of sensor, signal conditioning, and analog-to-digital converter errors. By utilizing a known, stable source, any error resulting from non-simultaneous sampling of the analog-to-digital converters can be directly evaluated and compensated for in the system. The effects of signal conditioning errors can be isolated by connecting the same stable input signal into the input of a plurality of signal conditioners. Once the effect of analog-to-digital conversion is factored out, any remaining error between channels is due to the signal conditioners. Finally, by connecting the probes to the same stable source, factoring out differences due to analog-to-digital conversion and phase distortion due to the signal conditioners, the phase errors due to probes themselves can be determined. Utilizing all of this information, system errors are compensated for by the computer 12 which applies the phase and amplitude corrections to all subsequent data. Compensation for system errors is important because it is desirable to measure current and voltage phases very accurately in order to accurately determine power factor and power (real, reactive and apparent), not only on a per phase basis, but also the total power factor and power for the polyphase motor 30. This result can be accomplished by utilizing a stable calibration source and an extremely accurate phase measurement technique based upon statistical estimation using accurate phase demodulation.

In general, meters are commercially available for measuring phase only to approximately 0.2 degrees. Such meters are expensive and yet still are insufficient for purposes of the present invention. For example, a 0.2 degree error in phase at a power factor of 0.035 produces a ten percent error in the power factor which in turn produces a ten percent error in other power measurements.

In order to obtain a significant improvement in phase accuracy, the present invention heterodynes the current and voltage measurements by a locally synthesized signal of approximately the same frequency. More specifically, the incoming electrical signal, once digitized, is multiplied by a cosine of a close frequency and by the negative of the sine of the same frequency. The two resulting products are each convolved with a low pass filter having a cut-off low enough to filter out the sum frequencies and any products of harmonics. The instantaneous phase is then determined as the arc tangent of the ratio of the imaginary portion of the result over the real portion of the result.

In order to map the arc tangent over a range of $2\pi$ and to avoid division by zero, the full algorithm is established as follows:

(a) if the real portion (denominator) is zero and the imaginary portion (numerator) is positive, the angle is $\pi$ over 2;

(b) if the real portion is zero and the imaginary portion is negative, the angle is minus $\pi$ divided by 2;

(c) if the imaginary portion and the real portion are both zero, the result is mapped into the quadrant between zero and $\pi$ divided by 2;

(d) if the imaginary portion is zero and the real portion is positive, the angle is zero;

(e) if the imaginary portion is zero and the real portion is negative, the angle is $\pi$; and (f) other combinations of the real and imaginary portions (positive and negative) are mapped in accordance with the analytic geometry conventions.

After the angle has been carefully distributed into the proper quadrants as discussed above, it is unwrapped by allowing the phase to continue to grow in value so that it does not go through sudden shifts when it progresses from $2\pi$ in one cycle to zero in the next. The preferred manner of accomplishing this result is to monitor the phase over time, keeping track (count) of the current $2\pi$ branch when unwrapping the phase. The kth branch is $K\, 2\pi+(0 \rightarrow 2\pi)$. For example $K=2$ corresponds to the range from $4\pi$ to $6\pi$. When the absolute value of a sudden range change in phase is greater than $\pi$, than $2\pi$, zero, or minus $2\pi$ is added, whichever results in the smallest change with respect to the most recent K branch. K is then changed accordingly.

The result of the foregoing is a smooth, differentiable plot of phase versus time. Preferably, data is collected for a predetermined time, such as seven seconds, and then the unwrapping calculation is performed, again for a predetermined time, preferably seven seconds. The first and last seconds of the data are deleted and whatever data is necessary to eliminate the end effects of the filter are also deleted. With the remaining central section of the data, a linear regression is performed, the intercept comprising an accurate statistical estimate of the phase at the beginning of the remaining central section of the data by having the start time be zero at the beginning of the central data section. After forming the foregoing calculation for several channels, the result can be compared for establishing phase differences between the channels.

An alternate method of accurately measuring phase is to determine the difference in phase at each instantaneous point between the channels being compared and calculate the mean value. Both the regression and averaging methods have the effect of enhancing the statistical accuracy of the measurement and thereby providing a substantial improvement over prior art phase measuring equipment.

As stated above, the present invention is used for analysis of electrical measurements in order to identify mechanical faults or deterioration of the motor 30 and/or transmission 36. One such mechanical problem which often occurs is a broken rotor bar. A broken rotor bar generally results in a reduction in torque in every rotation and has a corresponding effect on each of the three electrical phases. More specifically, the three phases cause three magnetic fields to rotate around at synchronous speed. The rotor rotates around more slowly, differing in speed by a slip frequency. Since each rotor bar rotates through each magnetic field twice, a broken rotor bar (which causes less back EMF than a non-broken rotor bar) effects each phase current at two times the slip frequency. The present state of the art is to examine the spectrum of the current in one phase for side bands separated from the line frequency by two times the slip frequency, and then determining if the amplitude is more than 1/1000th of the amplitude of the line frequency component. If only 1/500th less in amplitude, one might assume two broken rotor bars, etc. Also, if the motor is only lightly loaded the slip frequency is much less and the side bands either might not detected or because their frequency is so close to the line frequency, the side band frequency of the component might incorrectly be assumed to be two times slip frequency.

The present invention overcomes these problems in three ways. First, it utilizes the power factor for each phase as a function of time, box 408 in FIG. 4. Power factor is more sensitive than current in picking up the effect of a broken rotor bar especially when the motor is lightly loaded. Second, the power factor of each phase is analyzed for the time of the total slip period, which is one divided by the slip frequency. Each broken rotor bar shows up twice over this period, 180 degrees apart. In this way, multiple broken rotor bars and their corresponding location are clearly noted, not just conjectured about as is done presently. Finally, the power factor trace of each phase is compared with the power factor trace of the other two phases. A broken rotor bar shows up sequentially, first in phase a, then in phase b, then in phase c. A disturbance showing up in all three phases simultaneously is not indicative of a broken rotor bar. By analyzing all three phases, and using the clearest diagnostic representation of the problem, the present invention provides significantly improved definitive diagnostics not previously achievable.

Rotating eccentricity of the motor rotor, as with rotor unbalance, also affects all phases sequentially but has a smoother effect and can be distinguished from broken rotor bars by the resulting sinusoidal nature of the trace at two times slip frequency and the corresponding lack of harmonics which are generated.

Shaft torsional loads resulting from mechanical effects can also appear more clearly in the electrical measurements than the mechanical measurements. Such problems occur, for instance, in the presence of a damaged or missing tooth in a reduction gear train. The presence of a damaged or missing tooth may be identified by way of mechanical vibration sensors, but it will have a stronger torque modulation effect. As previously discussed, this invention allows the time traces of all three phases to be examined. In this case, under high torque loading, it is more effective to examine the real power traces for each phase, block 422 in FIG. 4. Here the damaged tooth is seen simultaneously in each of the three phase traces, unlike with broken rotor bars where the effect is sequential between phases. The damaged tooth effect repeats in the time traces every rotational period of the gear that the tooth is located on. If there were two damaged teeth on the gear, the effect is seen twice in each rotational period of the gear. Further, the separation of the two effects per rotational period of the gear mirrors the separation of the two damaged teeth on the gear itself so that more diagnostic information is obtained than is obtained using only spectral information, as is typical of the present state of the art.

Imbalance measurements are made utilizing the voltage, current, equivalent resistance and equivalent inductance determinations while the motor is actually operating. A significant current imbalance can cause motor overheating which can drastically reduce motor life.

While a periodic one-time analysis can detect serious problems for a short time span recorded during motor operation, historical trending can provide advanced warning of impending problems. By recording accurate measurements at different times and plotting the resulting records over time or otherwise automatically searching for trends over time, patterns can be detected that indicate a particular parameter is degrading or changing, indicating an impending fault condition while the motor is still operating within acceptable limits. For example, if the rotor of the motor is becoming uncentered or offset in the air gap, the magnetic field rotating around at synchronous speed for each phase would have rotor bars going by with reduced air gap on one side of the motor, and at the same time have rotor bars going by with increased air gap on the opposite side of the motor, This situation would repeat at, for example, zero degrees and 180 degrees in the synchronous cycle. At 90 degrees and 270 degrees in the synchronous cycle, both air gaps would be normal. Because the effect of an air gap change is not linear, but stronger at reduced gap than at increased gap, the effect of the motor rotor becoming eccentric results in an increased effect at both zero degrees and 180 degrees for this particular electrical phase. This increased effect showing up two times in the synchronous cycle in the current amplitude, the power factor, or the real power traces for that particular electrical phase, show up as well in the other phases, but are displaced in the synchronous cycle by 120 degrees from the traces of the original electrical phase. Thus, the comparison of traces between electrical phases confirms a diagnosis of an uncentered rotor. The effect can be noted when it is too small to be of concern, and as indicated here, it can be trended so that if it is getting worse, the point at which an operator will want to take corrective measures can be projected. This allowance for the preplanning of downtime is one of the essential benefits of trending. Also, it helps to ensure that the problem will be corrected before it becomes an operational problem, shortening motor life and perhaps resulting in catastrophic motor failure. Trending can best be achieved when the data being reviewed is very accurate. The use of the above-discussed demodulation techniques, correction of phase inaccuracies, correction of probe non-linearity, etc., of the present invention provides a practical way to achieve the required accuracy for proper trend analysis.

For optimum analysis of the motor system, mechanical measurements are also obtained in connection with the preferred embodiment of the present invention. In common usage are motion sensors which measure displacement, velocity or acceleration. Multiple motion sensors may also be employed. For example, perpendicular radial proximity probes can describe a shaft orbit which can, for instance, be employed for detecting a cracked shaft by evidencing two per revolution response. A third proximity probe in the axial direction can assist in detecting shaft misalignment. While proximity probes are employed for measuring the displacement of the shaft with respect to the bearings, inertial sensors, such as accelerometers, on the bearing housing, provide an indication of the motion of the bearing in inertial space. Accelerometers are commonly used because of their large dynamic range, sensitivity and ease of mounting. Preferably, accelerometers are employed in three orthogonal axes to ensure that no vibration signal is missed and to help diagnose the nature of a fault by determining which axis has the greatest amplitude. If only one accelerometer is utilized, it is preferably oriented radially on the housing proximate the output of the transmission 36.

A typical raw acceleration signal contains information about the motion of the bearing to which the accelerometer is attached. However, the information of interest may be obscured by irrelevant signals. Two alternative signals derived from the raw acceleration signal may be helpful to discriminate the desired information from the irrelevant signals. The first alternative signal comprises the low frequency components acquired from the raw acceleration signal by low pass filtering. Parameters such as low order harmonics of running speed and slip frequency are easier to detect from the low frequency components. The other modification of the raw acceleration signal consists of high pass filtering and then extracting the envelope of the resulting signal. The high pass filtering eliminates ordinary vibration signals, passing only impulse type signals, i.e., signals which are very short in the time domain which generate very high frequency. Such high frequency excitation stimulates the high natural frequencies of some of the motor and gear means structural components such as the bearing race. The natural frequencies themselves are not of interest since the natural frequencies act only as a signal carrier. The envelope is of more interest since it indicates the repetition pattern of the impulse fault. The repetition rate is useful for locating a fault such as a spall in the outer race of a bearing which generates an impulse each time a rolling element passes. Spectral analysis of the impulse repetition rate is used to determine if the outer race is at fault. The accelerometer envelope is useful for detecting impulsive signals originating from such faults as inner race, outer race, rolling element spalls, missing teeth in gears, and rotor rubbing. The low frequency accelerometer signal is useful for detecting and diagnosing misalignment between mechanical components such as between the motor and gear means, rotor unbalance, and some gear mesh abnormalities.

While many of the above-described faults can be detected from one time analysis, more subtle problems can be detected by trend analysis. For example, very early stages of motor rotor rubbing are detected by trending the envelope spectra over time, thus providing time to correct the fault before the fault reaches a dangerous stage.

The integration of mechanical and electrical analyses also provides an added benefit. For example, the damaged or missing tooth on a gear results in a distinctive vibrational signal which is picked up from the accelerometer measurement and a periodic torque anomaly which may be detected in the current, power and especially power factor traces. By comparing the two types of measurements and their phase relationships, the existence of the gear problem can be confirmed and the seriousness of the problem can be estimated. The exact angular location of the faulty tooth can also be determined.

As another example, changes in the efficiency of the motor/gear means drive system can be monitored. If the mechanical measurement is selected to be torque, such as measured by a wheatstone bridge strain gauge torque meter, and the electrical measurement selected is power, at a given speed, the ratio of the selected value should be constant. If it is observed that the output torque decreases over time while the motor power remains constant, a developing inefficiency, such as lubrication degradation, is suggested.

The concurrent use of electrical and mechanical sensors is also advantageous in that the two approaches complement each other. The electrical motor measurements are primarily sensitive to angle or torque modulations while the mechanical measurements are primarily sensitive to linear (radial or axial) modulation. Using the two types of sensors together is valuable in isolating a particular problem. For example, if a pump has an unbalanced impeller, a radial accelerometer at one of the pump bearings will see a once per revolution effect caused by the rotating imbalance force. The motor driving the pump will be unaware of the pump imbalance in any of its electrical traces, either directly measured or developed, since the pump rotor imbalance does not affect the torque of the motor. However, if the pump impeller imbalance becomes great enough, and if in addition the pump impeller is radially offset relative to its diffuser, this would cause the impeller to get very close (radially) to its diffuser during just one part of its rotational cycle. In turn causing a once per revolution mechanical vibration due to the imbalance, plus a once per revolution torque effect caused by the closeness to the diffuser that occurs once per revolution. This is reflected back to the motor as a once per revolution variation in the current, power factor, and real power traces. Additionally, the electrical traces of all three phases would exhibit this once per revolution variation simultaneously, thereby differentiating it from an offset motor rotor, or from a mechanically unbalanced motor rotor, both previously discussed.

The power of the present invention in diagnosing motor systems over the present state of the art derives from the inclusion of traces from more than one electrical phase to more clearly differentiate between different problems, the use of the analytic signal in demodulating the basic raw electrical signals to obtain vastly improved demodulated electrical traces, the combination of these improved electrical traces with mechanical traces to further differentiate between various problems, and improved calibration means for both probes and conditioning circuitry to allow more sensitive trending to be carried out.

The present invention further provides a method and apparatus for evaluating motor shaft output torque and motor horsepower without employing a dynamometer or other torque measuring equipment and eliminates the need for locked rotor testing. The present invention provides a method and apparatus for measuring the entire power locus (Heyland locus) from a no-load to a locked-rotor condition whenever the motor is turned on.

Figure 7A:
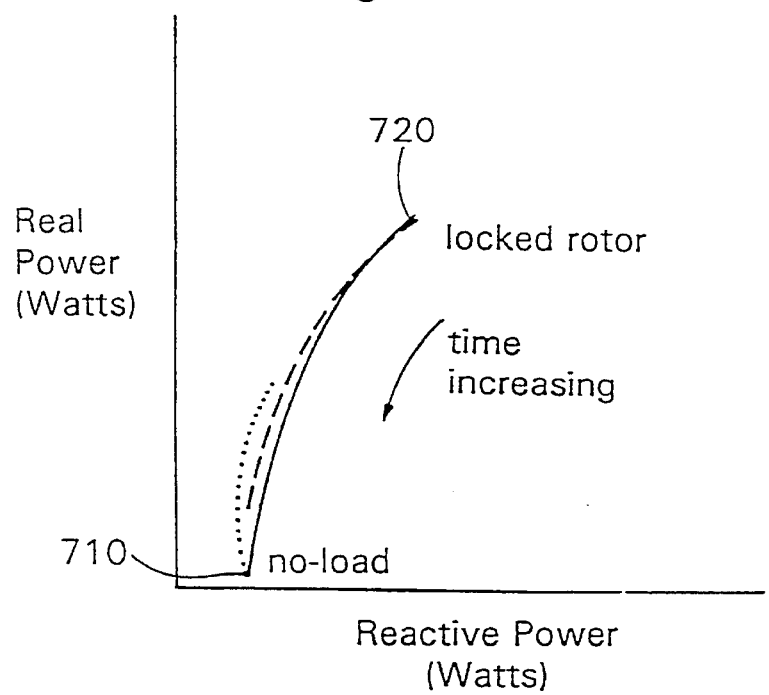
FIGS. 7A–7B are a graphic illustrations of a Heyland performance diagram of an induction motor.

Referring now to FIG. 7A, a trace of real power as a function of reactive power for a motor is shown. The "impulse" measurement provided by the present invention is shown as the solid line. The solid line is determined from processing measurements made in the short time span following application of power to an unloaded motor. The present invention measures the instantaneous variation of the real and reactive power functions. These functions are then appropriately filtered and duration limited and then cross-plotted. The dashed line in FIG. 7A illustrates the Heyland or circle performance diagram constructed by curve-fitting an arc to the no-load and the locked rotor test points, as is known in the art. The no-load test point is shown at point 710, and the locked rotor test point is shown at point 720. The short dotted line in FIG. 7A illustrates a performance diagram constructed using a plurality of test points from a dynamometer coupled to the output shaft of the motor at various steady state operating conditions.

Figure 7B:
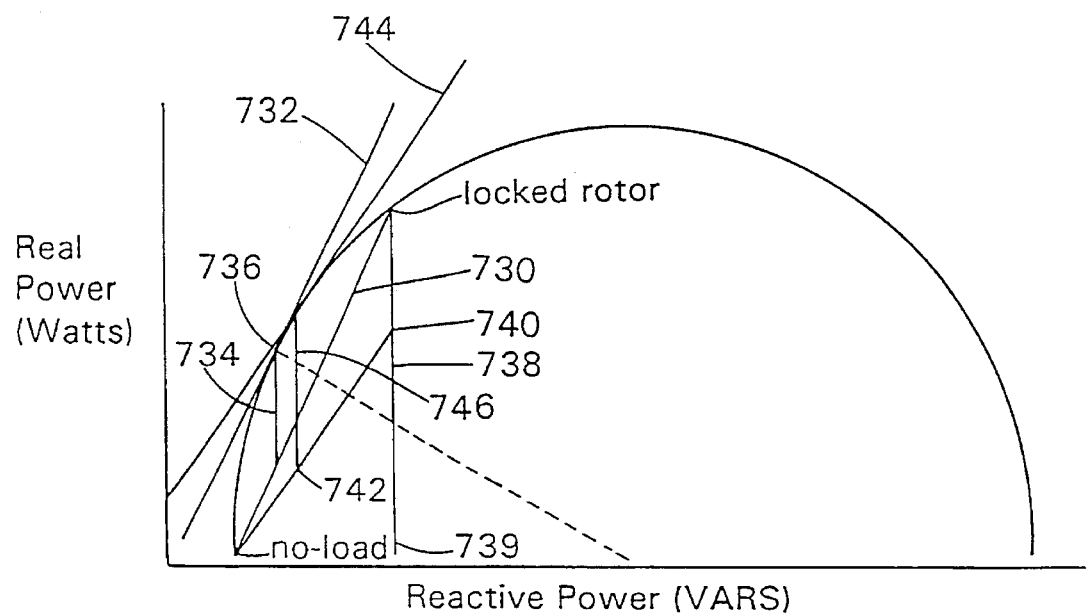

As is known to those of ordinary skill in the art, from a performance diagram, estimates of the maximum horsepower, horsepower at most efficient operation, maximum torque, starting torque, shaft power at any operating point and efficiency at any operating point may be calculated. FIG. 7B illustrates how some of the mechanical performance characteristics are derived from a performance diagram for an electrical motor. As is traditionally done, the total real power and the total reactive power measured from the no-load and the locked-rotor conditions are plotted on the diagram. A semicircle is fit through the no-load point and the locked rotor point, with the no-load point located on the horizontal diameter of the semicircle. A chord, indicated at 730, is drawn between the no-load and locked rotor points. A line, indicated at 732, is drawn tangent to the semicircle and parallel to the chord 730. Then, the maximum output power (watts) is determined as the length of the vertical line 734 drawn from the point of tangency, point 736, to the chord 730. This figure may then be converted to horsepower by multiplying by 1.34 and dividing by 1000. A line drawn tangent to the semicircle from the oroigin is termed the "optimum power factor" tangent (not shown). The cosine of the angle between this "optimum power factor" tangent and the vertical axis is the associated power factor. The power factor at other operating points (on the Heyland locus) are determined in like manner.

Additional information can be derived from the performance diagram using the DC resistance of each phase coil, the RMS phase currents and phase power factors at the locked rotor point. The primary copper loss at stand-still (PCL) is calculated in accordance with:

$$PCL = R_a(I_a PF_a)^2 + R_b(I_b PF_b)^2 + R_c(I_c PF_c)^2 \text{ (watts)};$$

and then, using the performance diagram, drawing a vertical line, indicated as line 738, from the locked rotor point to the semicircle diameter, indicated at point 739, and measuring the PCL (watts) as the distance along line 738 between points 739 and 740. A line 742 from point 740 to the no-load point and a tangent 744 to the semicircle parallel to line 742, allows the maximum torque to be determined by measuring the wattage along a vertical line, indicated as the line 746, from the point of tangency of tangent 744 to the line 742. The equivalent torque at the motor's operating RPM is then calculated according to:

$$Lb_f - In = 84.45 \text{ Watt/synchronous speed;}$$

where the synchronous speed is in cycles per minute. The power equivalent to the starting torque is determined by measuring the vertical line 738 from the locked rotor point to primary copper loss point, 740. This wattage is converted to the starting torque, also in accordance with:

$$Lb_f - In = 84.45 \text{ Watt/synchronous speed.}$$

The primary copper loss at any operating point (on the Heyland locus) can be determined as the vertical distance from line 742 to the diameter of the circle.

Figure 8A:
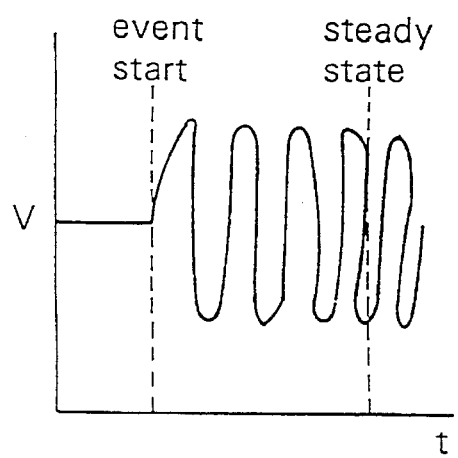
FIGS. 8A–8B are a graphic illustrations of a voltage time history and a current time history, respectively, as power is applied to the motor.
Figure 8B:
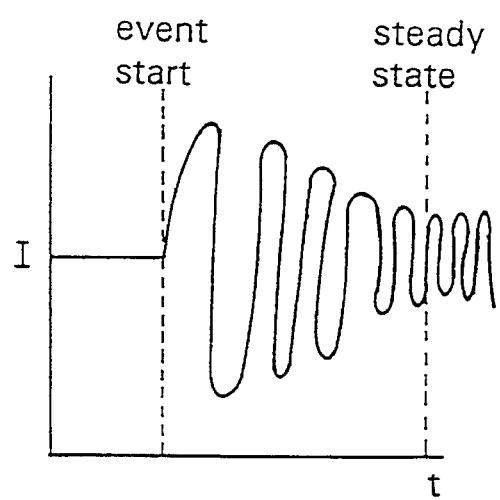

The present invention eliminates the need for locked rotor testing and measures the entire path line from no-load to the locked-rotor condition whenever the motor is turned on by plotting total real power versus total reactive power every time the motor is started. These measurements are performed without employing a dynamometer or other torque measuring equipment. As previously discussed and illustrated in FIG. 1, the line to line voltages across the motor terminals and the currents entering each phase coil of the motor 30 are measured. The voltage measurements are made using sensors 48, 50, 52 and the currents are transduced using current probes 42, 44, 46. Also as previously discussed, the current and voltage sensors generate analog signals which are appropriately conditioned by circuits which standardize the signals prior to converting the analog signals to digital signals. Standardization of signals includes conversion of currents to a proportional voltage, amplitude scaling and appropriate filtering to limit bandwidth. Measurement is begun with the motor in an off-condition. Power is applied to the motor 30 and the signal acquisition means 42, 44, 46, 48, 50, 52 acquires and retains time histories of the three voltages and currents (i.e. per phase). FIG. 8A illustrates a typical voltage time history for one of the electrical phases of the motor 30 measured as power is applied to the motor 30. The potential rises rapidly from zero to a full rated sinusoidal level and remains fixed in amplitude thereafter. FIG. 8B illustrates the resulting time history of one of the currents applied to the motor 30. The sinusoidal phase current undergoes a characteristic modulation pattern during start-up. There is an initial in-rush followed by a nearly exponential decay to the steady-state running condition of the motor 30. During this time interval, the shaft 36 is accelerating from standstill to a speed just slightly less than the motor system synchronous speed. Thereafter, the shaft 36 rotates at constant velocity. In essence, the motor's inertia provides a locked-rotor condition for the first few milliseconds of operation. This is reflected by the initial current in-rush. Following the initial current in-rush, the motor 30 accelerates with an attendant reduction in the driving currents as the back EMF builds up with speed and eventually, the motor 30 reaches its steady-state speed. Since the motor 30 is uncoupled from any external load, this limit is the no-load condition. Demodulation of the sensed current signal and the sensed voltage signal is performed to derive the instantaneous RMS voltages and currents, as well as the power factors for each phase. The demodulation may be accomplished in either the time or frequency domain utilizing suitable Hilbert transform based algorithms acting upon the stored voltage and current time histories.

Figure 9A:
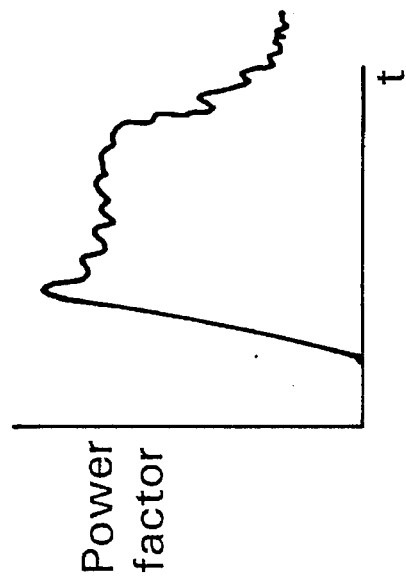
FIGS. 9A–9C are graphic illustrations of RMS voltage, RMS current, and power factor time histories, respectively, as power is applied to the motor.
Figure 9B:
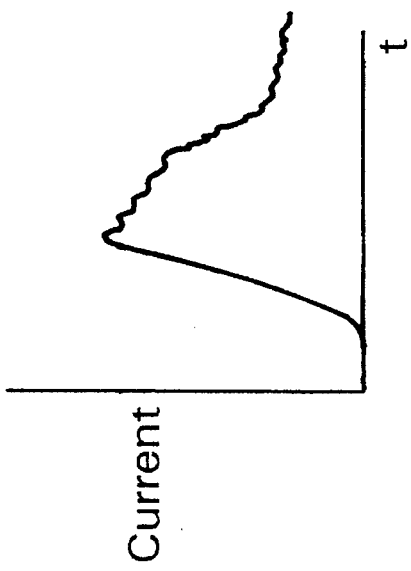
Figure 9C:
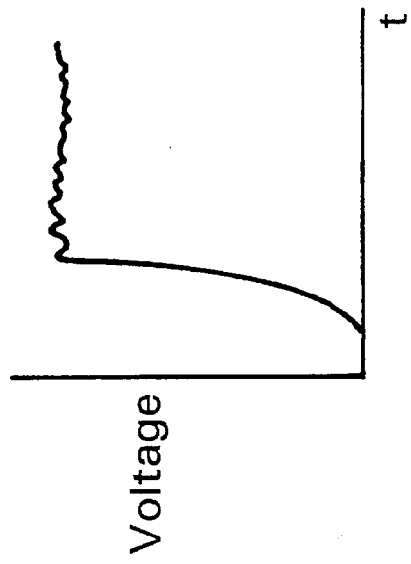

FIGS. 9A, 9B and 9C illustrate the output time histories for the RMS voltage, the RMS current, and the power factor for a single electrical phase of the motor 30. The RMS voltages and currents and their associated power factors for each electrical phase of the motor may be algebraically combined to yield the total real power and the total reactive power of the motor 30. These instantaneous time histories reflect the combined actions of the three electrical phases of the motor 30. The total real power and the total reactive power are determined as previously discussed above and illustrated in FIG. 4. However, the motor 30 previously described illustrates a motor started directly across the power mains. This is generally the most common means of starting a motor, especially for motors under 250 h.p. Some motors, however, particularly larger motors, are started by applying a time varient supply voltage that starts at a reduced voltage and increases as the motor comes up to speed. This is done to reduce the current in-rush supplied by the power grid. Such "soft-start" operation effects the resulting real and reactive power time histories. Accordingly, an additional computational step is performed to ensure accurate data is obtained. Specifically, the real power and the reactive power signals of each phase are normalized before forming the total real power and the total reactive power signals. The signals are normalized using the RMS voltage of each phase. A steady-state voltage ($V_{ss}$) for the phase is measured at a point beyond the 3T point (shown in FIG. 10A). The real and reactive power signals (at time=t) are normalized by multiplying their measured values by $(V_{ss}/V(t))^2$. After normalizing the power signal of each phase, the total power signal (real/reactive) is calculated by summing the normalized power signal of each phase.

Figure 10A:
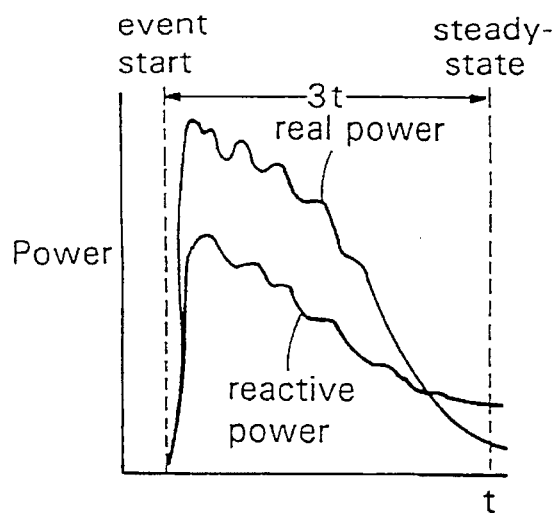
FIG. 10A is a graphic illustration of the time histories of the power functions of the motor.
Figure 10B:
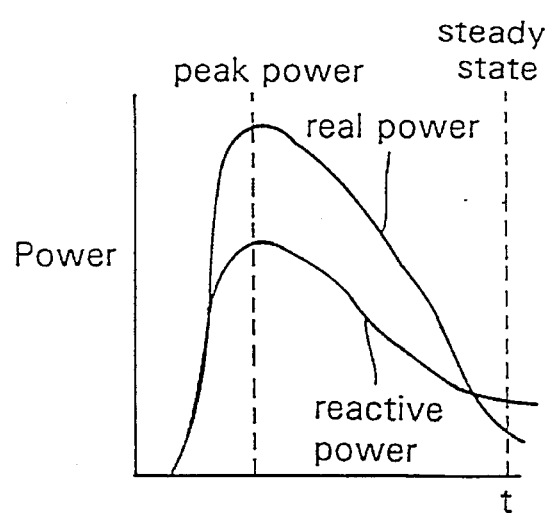
FIG. 10B is a graphic illustration of the power time histories of FIG. 10A after the power functions have been low-pass filtered.

FIG. 10A illustrates a typical power time history. The ringing character of the real and reactive power traces immediately following the "start" are typical. These are the electrical reflection of the torque pulsations that characterize the starting transient of an induction motor. The present invention eliminates the ringing from the traces prior to cross-plotting so that the resulting performance map is not distorted with a series of artifactual loops. The ringing is eliminated by low pass filtering the power functions to produce smooth functions that plot free of the undesired artifacts (FIG. 10B). The bandwidth of the low-pass filter is carefully determined. A filter having a 3 dB bandwidth which is too wide will fail to remove the ringing and a filter bandwidth that is too narrow will erroneously limit the peak values, yielding an error in the perceived locked-rotor condition. The filter bandwidth must be as narrow as possible without introducing a significant convolution error as the rotor accelerates up to speed. The filter is fixed in frequency and the signal content sweeps as the motor accelerates. The motor accelerates from rest to approximately synchronous speed ($f_{sync}$) numerically equal to twice the power line frequency divided by the number of motor poles. Since the motor 30 is uncoupled from a load, the motor's inertia determines the instantaneous frequency of shaft rotation ($f_{shaft}$) during start-up. The shaft speed may be approximated by the exponential expression:

$$f_{shaft}=f_{sync}(1-e^{-t/T})$$

where T is the motor time constant determined by the starting torque and inertia. The nature of such exponential systems is understood by those of ordinary skill in the art. $F_{shaft}$ will attain 95 percent of its terminal speed, $f_{sync}$, in three time constants or t=3T. Thus, a reasonable estimate of the time constant is one-third of the time from the application of power until the traces reflect steady state. This is indicated by the 3T interval marked in FIG. 10A. The maximum rate of shaft frequency change occurs immediately upon power application to the motor 30. Thereafter, the shaft acceleration gradually reduces to zero. The maximum rate of frequency change is thus:

$$\max(d(f_{shaft})/dt)=f_{sync}/T.$$

Thus, the minimum bandwidth smoothing filter has a 3 dB bandwidth determined by:

$$f_{3db}=\sqrt{}/(f_{sync}/T).$$

Application of such a low pass filter smooths the power traces resulting in their central values, as shown in FIG. 10B. In the presently preferred embodiment, digital signals representative of the power factors determined in software using the data input to the computer 12 are digitally filtered using software in accordance with the foregoing discussion. However, it will be apparent to one of ordinary skill in the art that separate filters having the appropriate bandwidth could be used to filter analog signals representative of the demodulated power components.

Prior to cross-plotting the total real power signal as a function of the total reactive power signal, the rising portion representative of the in-rush is eliminated. If the rising portion representative of the in-rush is not eliminated, the performance diagram will contain an unwanted line between the origin and the locked-rotor point. Accordingly, the power factor data to be cross-plotted is limited to that between the power peaks and the onset of steady-state operation. This is shown in FIG. 10A as the area between the peak power line and the steady-state line. The time-limiting is again performed in software in the computer 12. The filtered and time-limited power signals are then cross-plotted with the total real power as a function of the total reactive power (FIG. 7A). According to the present invention, this performance map can be measured and displayed whenever power is applied to the uncoupled motor.

The method can also be extended to motors coupled to a normal working load. The performance map shown in FIG. 7A shows a performance sweep from the locked-rotor state toward the no-load state as time increases. If the motor 30 is coupled to a load, the resulting sweep stops short of the no-load point. The no-load point can then be extrapolated by curve-fitting an arc to the measured locus. While such extrapolation may reduce the precision of horsepower and torque computations slightly, the ability to deduce shaft torque and power at every normal start-up is of great benefit. The method, thus allows electrical and mechanical performance measurements of the motor/load combination to be determined by extracting the information from the perfomance diagram, as previously described. Some of the performance measurements which may be extracted are the maximum horsepower, the horsepower at most efficient operation, the shaft power at any operating point, the shaft power at the actual operating point, the maximum torque, the starting torque, efficiency at any operating point, efficiency at the actual operating point, primary copper loss at any operating point, primary copper loss at the actual operating point, the power factor at any operating point and the power factor at the actual operating point.

As can be seen, the present invention provides a method and apparatus for providing a performance map of a polyphase electrical motor using an electrical signature of the motor during start-up from the sensed current and voltage signals applied to the motor for each electrical phase of the motor. Additionally, a reasonable approximation of the performance map can be generated by measuring only a single instantaneous current signal and a single instantaneous voltage signal of the polyphase motor 30, as opposed to measuring each/all of the currents and voltages input to the motor 30. In order to determine an approximation of the total real power and the total reactive power signals, the real power signal for a single phase is multiplied by the number of phases to estimate the total real power signal as a function of time and the reactive power signal for a single phase of the motor is multiplied by the number of phases to estimate the total reactive power signal as a function of time.

The ability to measure mechanical performance characteristics from the electrical signature of the motor 30 provides useful diagnostic information. For example, degradation of the motor system is reflected by reduced performance extremes. The performance map can be used as a simple and effective monitoring tool and can be analyzed to provide valuable diagnostic information.

From the foregoing description, it can be seen that the present invention comprises an improved method and apparatus for on-line analysis of polyphase electrical motors and their driven machines. It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention as defined by the appended claims.

We claim:

1. A method of determining power signals of a polyphase electrical motor system using an electrical signature of the motor during startup comprising the steps of:

a. sensing an instantaneous current signal supplied to the motor as a function of time for at least one electrical phase of the motor;

b. sensing an instantaneous voltage signal supplied to the motor as a function of time for at least one electrical phase of the motor;

c. amplitude demodulating the sensed current signals and the sensed voltage signals to provide an amplitude demodulated current signal as a function of time and an amplitude demodulated voltage signal as a function of time for the at least one electrical phase of the motor;

d. determining an instantaneous power factor as a function of time between the sensed current signals and the sensed voltage signals for the at least one electrical phase of the motor; and e. using the amplitude demodulated current and voltage signals and the instantaneous power factor for the at least one electrical phase of the motor to determine a total real power signal as a function of time and a total reactive power signal as a function of time;

f. low-pass filtering the total real power signal and the total reactive power signal;

g. time-limiting the filtered, total real power signal and the filtered, total reactive power signal to span from a peak of the total real power signal and a peak of the total reactive power signal to a beginning of steady-state operation of the motor; and h. cross-plotting the time-limited total real power signal as a function of the time-limited total reactive power signal.

2. The method as recited in claim 1 wherein electrical and mechanical performance measurements of the motor are extracted from the cross-plot of total real power against total reactive power.

3. The method as recited in claim 2 wherein the electrical and mechanical performance measurements of the motor extracted from the cross-plot include one or more of:
   (a) maximum horsepower;
   (b) horsepower at most efficient operation;
   (c) shaft power at any operating point;
   (d) maximum torque;
   (e) starting torque;
   (f) efficiency at any operating point;
   (g) primary copper loss at any point; and
   (h) power factor at any operating point.

4. The method as recited in claim 1 wherein the instantaneous power factor is determined using the cosine of the voltage/current phase difference of the sensed current and voltage signals.

5. A method of determining power signals of a polyphase electrical motor system using an electrical signature of the motor during startup comprising the steps of:
   a. sensing an instantaneous current signal supplied to the motor as a function of time for at least one electrical phase of the motor;
   b. sensing an instantaneous voltage signal supplied to the motor as a function of time for at least one electrical phase, of the motor:
   c. amplitude demodulating the sensed current signals and the sensed voltage signals to provide an demodulated current signals as a funtion of time and an amplitude demodulated voltage signal as a function of time for the at least one electrical phase of the motor;
   d. phase demodulating the sensed current signals and the sensed voltage signals to provide a phase demodulated current signal as a function of time and a phase demodulated voltage signal as a function of time for at least one electrical phase of the motor; and
   e. using the amplitude demodulated current and voltage signals and the phase demodulated current and voltage signals to determine a total real power signal as a function of time and a total reactive power signal as a function of time.

6. The method as recited in claim 1 further comprising the steps of:
   generating standardized current signals and standardized voltage signals from the sensed current signals and the sensed voltage signals; and
   converting the standardized current and voltage signals to digital signals prior to the amplitude demodulating step and determining the instantaneous power factor.

7. The method as recited in claim 6 wherein the generating step comprises converting the sensed current and voltage signals to a proportional voltage signal, amplitude scaling the proportional voltage signal and filtering the scaled voltage signal.

8. The method as recited in claim 1 wherein the step of low pass filtering is performed using a filter wherein a bandwidth of the filter is determined from a time interval between the application of voltage to the motor and the achievement of steady-state operation by the motor.

9. The method as recited in claim 8 wherein the minimum filter bandwidth comprises a 3 dB bandwidth determined by:

$$f_{3dB} = \sqrt{(f_{sync}/\tau)};$$

where $\tau$ is the motor time constant determined by starting torque and inertia; and $f_{sync}$ = synchronous speed of the motor.

10. The method as recited in claim 1 wherein step (e) further comprises the sub-steps of:
    normalizing the real power signal and the reactive power signal by multiplying each power signal by a square of an RMS voltage at steady-state and dividing by a square of a corresponding instantaneous RMS voltage signal; and
    summing the real power signal per phase for all phases on a time-point by time-point basis to provide a total real power signal as a function of time and summing the reactive power signal per phase for all phases on a time-point by time-point basis to provide a total reactive power signal as a function of time.

11. The method as recited in claim 1 wherein step (e) further comprises the sub-steps of:
    normalizing the real power signal and the reactive power signal for the at least one electrical phase of the motor by multiplying each power signal by a square of an RMS voltage at steady-state and dividing by a corresponding instantaneous RMS voltage signal; and
    multiplying the real power signal of one phase by the number of phases to estimate a total real power signal as a function of time from measurements of a single phase and multiplying the reactive power signal for one phase by the number of phases to estimate a total reactive power signal as a function of time from measurements of a single phase.

12. An apparatus for analyzing a polyphase motor system using an electrical signature of the motor during startup comprising:
    a. current sensing means for transducing currents applied to the motor and generating an analog current signal for at least one electrical phase of the motor;
    b. voltage sensing means for sensing line voltages applied to the motor and generating an analog voltage signal for at least one electrical phase of the motor;
    c. analog-to-digital converter means for converting the analog current and voltage signals to digital current and voltage signals;
    d. storage means for storing a time history of the digital current and voltage signals;
    e. demodulation means for generating instantaneous RMS current and RMS voltage signals from the digital current and voltage signals;
    f. arithmetic means for determining instantaneous total reactive power and instantaneous total real power signals using the instantaneous RMS current and instantaneous RMS voltage signals;
    g. low pass filtering means for bandwidth limiting the total real power signal and the total reactive power signal;
    h. time-limiting means for time limiting the total real power signal and the total reactive power signal; and i. plotting means for cross-plotting the total real power as a function of the total reactive power.

13. An apparatus for analyzing a polyphase motor system using an electrical signature of the motor during startup comprising:
   a. a current sensor for transducing currents applied to the motor and generating an analog current signal for at least one electrical phase of the motor;
   b. a voltage sensor for sensing line voltage applied to the motor and generating an analog voltage signal for at least one electrical phase of the motor;
   c. an analog-to-digital converter for converting the analog current and voltage signals to digital current and voltage signals;
   d. a storage device for storing a time history of the digital current and voltage signals;
   e. a demodulator for generating amplitude demodulated current and voltage signals and phase demodulated power factor signals from the digital current and voltage signals;
   f. an arithmetic unit for determining instantaneous total reactive power and instantaneous total real power signals using the digital current and voltage signals;
   g. an arithmetic low-pass filter for bandwidth limiting the total real power signal and the total reactive power signal;
   h. an arithmetic time-limiter for time limiting the filtered, total real power signal and the filtered, total reactive power signal; and
   i. a plotting device for cross-plotting the time-limited, filtered, total real power signal as a function of the time-limited, filtered, total reactive power.

14. The apparatus of claim 13 wherein the arithmetic unit normalizes the real and reactive power signals to account for time variation of the supplied voltage.

15. The apparatus of claim 13 wherein the motor is coupled to a load.

16. The method as recited in claim 15 further comprising the step of curve-fitting an arc to the cross-plot to determine a no-load data point.

17. The method as recited in claim 16 wherein the electrical and mechanical performance measurements of the motor/load combination are extracted from the cross-plot of total real power against total reactive power.

18. The method as recited in claim 17 wherein the electrical and mechanical performance measurements of the motor/load combination extracted from the cross-plot include one or more of:
   (a) maximum horsepower;
   (b) horsepower at most efficient operation;
   (c) shaft power at any operating point;
   (d) shaft power at the actual operating point;
   (e) maximum torque;
   (f) starting torque;
   (g) efficiency at any operating point;
   (h) efficiency at the actual operating point;
   (i) primary copper loss at any operating point;
   (j) primary copper loss at the actual operating point;
   (k) power factor at any operating point; and
   (l) power factor at the actual operating point.

* * * * *